United States Patent
Otsubo et al.

(10) Patent No.: US 10,455,701 B2
(45) Date of Patent: Oct. 22, 2019

(54) RESIN BOARD STRUCTURE AND METHOD FOR FABRICATING THE SAME

(71) Applicant: Murata Manufacturing Co., Ltd., Nagaokakyo-shi, Kyoto-fu (JP)

(72) Inventors: Yoshihito Otsubo, Nagaokakyo (JP); Masaaki Minami, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/907,366

(22) Filed: Feb. 28, 2018

(65) Prior Publication Data

US 2018/0192518 A1 Jul. 5, 2018

Related U.S. Application Data

(63) Continuation of application No. PCT/JP2016/077126, filed on Sep. 14, 2016.

(30) Foreign Application Priority Data

Oct. 2, 2015 (JP) .................................. 2015-196723

(51) Int. Cl.
*B23K 20/10* (2006.01)
*H05K 1/14* (2006.01)
(Continued)

(52) U.S. Cl.
CPC ............. *H05K 1/142* (2013.01); *B23K 20/10* (2013.01); *B29C 65/08* (2013.01); *B29C 65/081* (2013.01);
(Continued)

(58) Field of Classification Search
CPC ........ Y10T 428/19; B23K 20/10; B29C 65/08; H05K 1/14; H05K 3/36; H05K 2203/0285

See application file for complete search history.

(56) References Cited

U.S. PATENT DOCUMENTS

| 6,523,734 B1 | 2/2003 | Kawai et al. |
| 2003/0146734 A1 | 8/2003 | Kozu et al. |

FOREIGN PATENT DOCUMENTS

| JP | 2001-007511 A | 1/2001 |
| JP | 2002-141052 A | 5/2002 |

(Continued)

OTHER PUBLICATIONS

Official Communication issued in International Patent Application No. PCT/JP2016/077126, dated Dec. 6, 2016.

*Primary Examiner* — Alexander S Thomas
(74) *Attorney, Agent, or Firm* — Keating & Bennett, LLP

(57) ABSTRACT

A resin board structure includes a first member including a first metal film and one thermoplastic resin layer or a stack which includes two or more thermoplastic resin layers, and a second member including a second metal film. The first and second metal films are bonded together, and at least a portion the first metal film and at least a portion of the second metal film overlap each other. The first and second metal films are metallurgically bonded at an interface between the first metal film and the second metal film. The first member includes a first junction resin covering portion defined by a portion of a thermoplastic resin layer and overlapping a portion at which the first metal film and the second metal film overlap each other, and the first junction resin covering portion includes an uneven surface to reduce or prevent slippage due to ultrasonic vibration.

17 Claims, 6 Drawing Sheets

(51) Int. Cl.
  *B29C 65/08* (2006.01)
  *B32B 15/08* (2006.01)
  *H05K 3/36* (2006.01)
  *B29C 65/00* (2006.01)
  *H05K 3/32* (2006.01)
  *B29L 31/34* (2006.01)
  *H05K 1/03* (2006.01)
  *H05K 1/11* (2006.01)
  *B29K 705/02* (2006.01)

(52) U.S. Cl.
  CPC .... B29C 66/1282 (2013.01); B29C 66/12841 (2013.01); B29C 66/43 (2013.01); B29C 66/72321 (2013.01); B29C 66/73161 (2013.01); B29C 66/73921 (2013.01); B29C 66/742 (2013.01); B29C 66/81419 (2013.01); B29C 66/8322 (2013.01); B32B 15/08 (2013.01); H05K 3/328 (2013.01); H05K 3/36 (2013.01); H05K 3/368 (2013.01); *B29C 66/71* (2013.01); *B29K 2705/02* (2013.01); *B29K 2995/0072* (2013.01); *B29K 2995/0074* (2013.01); *B29L 2031/3425* (2013.01); *B32B 2457/08* (2013.01); *H05K 1/0313* (2013.01); *H05K 1/117* (2013.01); *H05K 1/147* (2013.01); *H05K 2201/0129* (2013.01); *H05K 2201/0195* (2013.01); *H05K 2201/0338* (2013.01); *H05K 2201/09036* (2013.01); *H05K 2203/0278* (2013.01); *H05K 2203/0285* (2013.01); *Y10T 428/19* (2015.01)

(56) References Cited

FOREIGN PATENT DOCUMENTS

| | | |
|---|---|---|
| JP | 2005-223054 A | 8/2005 |
| JP | 2006-024590 A | 1/2006 |
| JP | 2014-072270 A | 4/2014 |

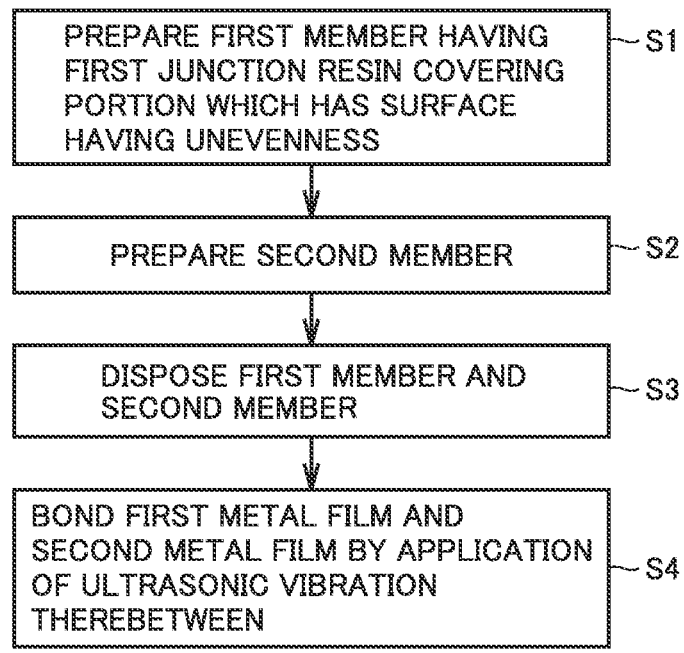

RESIN BOARD STRUCTURE AND METHOD FOR FABRICATING THE SAME

CROSS REFERENCE TO RELATED APPLICATIONS

This application claims the benefit of priority to Japanese Patent Application No. 2015-196723 filed on Oct. 2, 2015 and is a Continuation Application of PCT Application No. PCT/JP2016/077126 filed on Sep. 14, 2016. The entire contents of each application are hereby incorporated herein by reference.

BACKGROUND OF THE INVENTION

1. Field of the Invention

The present invention relates to a resin board structure and a method for fabricating the same.

2. Description of the Related Art

Japanese Patent Laid-Open No. 2001-7511 discloses a technology of fusing metals together by application of ultrasonic vibration, as a method for bonding circuit boards together. According to Embodiment 1 of Japanese Patent Laid-Open No. 2001-7511, an object having a conductor pattern formed thereon by etching copper foil on the surface of a PET film and an object having a conductor pattern formed thereon by etching aluminum foil on the surface of a PET film are overlapped so that the copper foil conductor pattern and the aluminum foil conductor pattern are in contact, and the objects are sandwiched between an ultrasonic horn and an anvil and ultrasonic vibration is applied to the objects. According to Embodiment 2 of Japanese Patent Laid-Open No. 2001-7511, at least one of the ultrasonic horn and the anvil has an end face having multiple projections, and resin boards are fused together by ultrasonic vibration through holes created by plastic flow of metal.

Japanese Patent Laid-Open No. 2006-24590 discloses a method of use of an ultrasonic horn having a corrugated tip to bond terminals of flexible circuit boards by ultrasonic bonding.

If at least one of two circuit boards that are ultrasonically bonded together includes a thermoplastic resin layer, the method disclosed as Embodiment 1 in Japanese Patent Laid-Open No. 2001-7511 may cause the thermoplastic resin to slip during application of the ultrasonic vibration. This is due to the flexibility of the thermoplastic resin. If the ultrasonic vibration causes the slip, the ultrasonic vibration may not be applied to the circuit boards as intended and bonding failure may occur, or the circuit boards may be misaligned relative to each other.

For the method disclosed as Embodiment 2 in Japanese Patent Laid-Open No. 2001-7511, it is assumed that the holes are created in the metallic foil conductor pattern. Thus, the method can be employed to bond such circuit boards that have no problem for use even when holes are created in the conductor pattern. Moreover, at the alignment phase of the circuit boards with a jig for the ultrasonic bonding, a slip is caused by the ultrasonic vibration, unless the resin layer conforms the unevenness of the jig. This may cause bond failure to occur or the resin layer to be misaligned relative to the jig.

The method disclosed in Japanese Patent Laid-Open No. 2006-24590 may cause bond failure to occur or the resin layer to be misaligned due to a slip caused by the ultrasonic vibration, until the ultrasonic horn eats into the surface of the flexible circuit board at the initial phase.

SUMMARY OF THE INVENTION

Preferred embodiments of the present invention provide resin board structures and methods for fabricating the same which provide ultrasonic bonding while reducing or preventing slippage due to the ultrasonic vibration and reducing or preventing the occurrence of bonding failure or misalignment due to the slippage.

A resin board structure according to a preferred embodiment of the present invention includes a first member including a first metal film and one thermoplastic resin layer or a stack which includes two or more thermoplastic resin layers; and a second member including a second metal film, wherein the first metal film and the second metal film are bonded together, at least a portion of the first metal film and at least a portion of the second metal film overlap each other, the first metal film and the second metal film are metallurgically bonded at an interface between the first metal film and the second metal film, the first member includes a first junction resin covering portion which is a portion of a thermoplastic resin layer and overlaps a portion at which the first metal film and the second metal film are overlap each other, and the first junction resin covering portion includes an uneven surface including unevenness to reduce or prevent slippage due to ultrasonic vibration.

In a resin board structure according to a preferred embodiment of the present invention, the first junction resin covering portion includes the uneven surface to reduce or prevent slippage due to ultrasonic vibration, thus enabling the ultrasonic bonding while reducing or prevent slippage due to the ultrasonic vibration and reducing or preventing the occurrence of bond failure or misalignment due to the slippage. Thus, a resin board structure having a good bond is achieved.

The above and other elements, features, steps, characteristics and advantages of the present invention will become more apparent from the following detailed description of the preferred embodiments with reference to the attached drawings.

BRIEF DESCRIPTION OF DRAWINGS

FIG. 13 is a flowchart of a method for fabricating the resin board structure according to Preferred Embodiment 7 of the present invention.

DETAILED DESCRIPTION OF THE PREFERRED EMBODIMENTS

Figure 1:
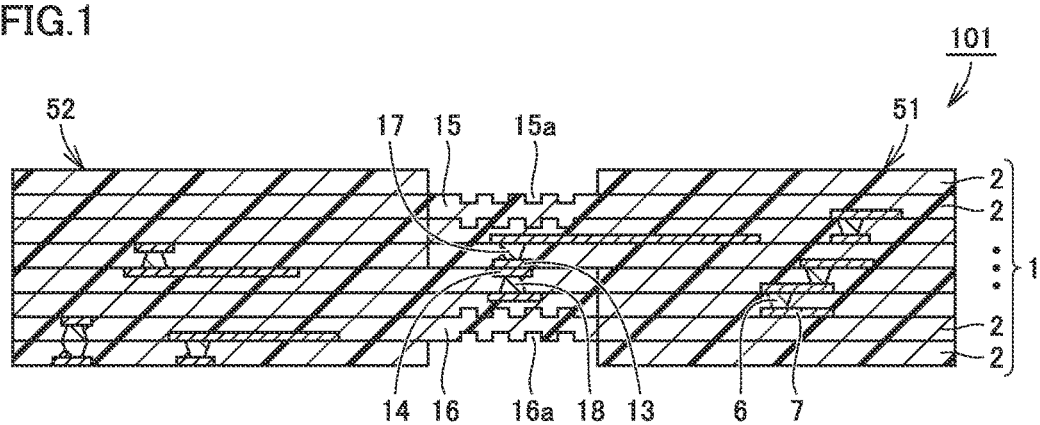
FIG. 1 is a cross-sectional view of a resin board structure according to Preferred Embodiment 1 of the present invention.

The dimensions shown in the drawings are not strictly to scale, and may be exaggerated for convenience of illustration. In the following description, reference made to the idea of above/top or below/bottom means above/top or below/bottom relative to the orientation shown in the drawings, rather than absolute above/top or below/bottom.

Preferred Embodiment 1

Referring to FIGS. 1 through 4, a resin board structure according to Preferred Embodiment 1 of the present invention is described. FIG. 1 shows a cross-sectional view of a resin board structure 101 according to the present preferred embodiment.

Resin board structure 101 includes a first member 51 including a first metal film 13 and one thermoplastic resin layer or a stack 1 which includes two or more thermoplastic resin layers 2; and a second member 52 including a second metal film 14. First metal film 13 and second metal film 14 are bonded together, at least a portion of first metal film 13 and at least a portion of second metal film 14 overlap each other. First metal film 13 and second metal film 14 are metallurgically bonded at an interface between first metal film 13 and second metal film 14. First member 51 includes a first junction resin covering portion 15 which is a portion of thermoplastic resin layer 2 and overlaps a portion at which first metal film 13 and second metal film 14 overlap each other. First junction resin covering portion 15 includes a surface including unevenness 15a to reduce or prevent slippage due to ultrasonic vibration.

First metal film 13 and second metal film 14 are metallurgically bonded by ultrasonically bonding separate films, i.e., first metal film 13 and second metal film 14. For the ultrasonic bonding, an oxide, dust, etc. present on the interface is removed by the ultrasonic vibration before bonding, which brings crystal grains of metal close to each other to interatomic distance. A strong force of attraction is thus exerted between first metal film 13 and second metal film 14, and the metallurgical bond is created therebetween. Resin board structure 101 includes portions that are metallurgically bonded in such a manner.

Figure 2:
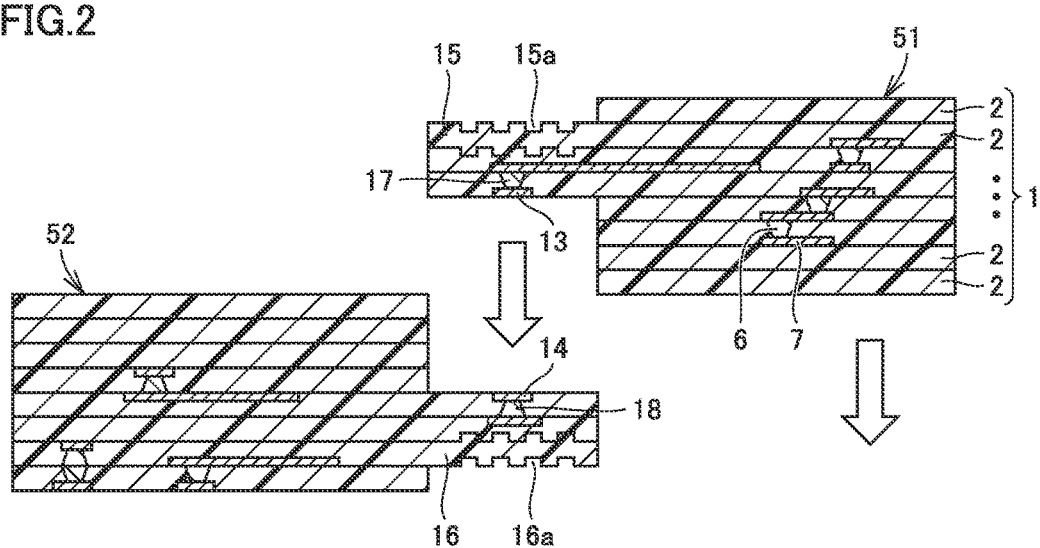
FIG. 2 is an illustration of a way to assemble a first member and a second member in order to obtain the resin board structure according to Preferred Embodiment 1 of the present invention.
Figure 3:
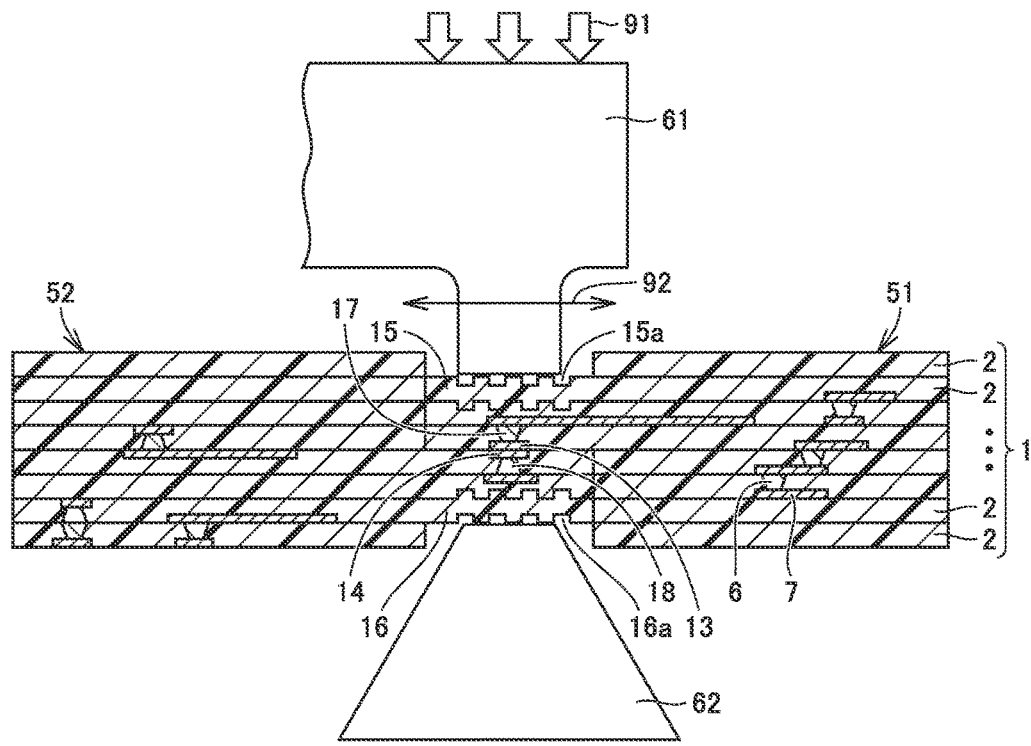
FIG. 3 is an illustration of a way of ultrasonic bonding in order to obtain the resin board structure according to Preferred Embodiment 1 of the present invention.
Figure 4:
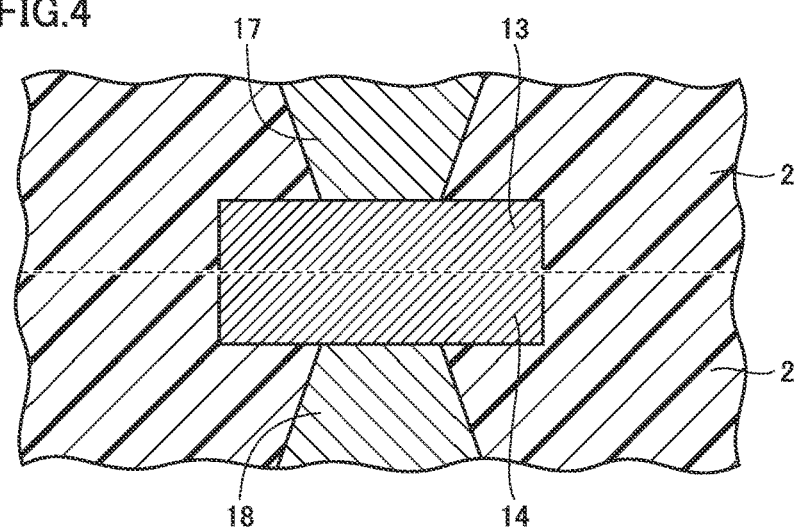
FIG. 4 is an enlarged cross-sectional view of a junction between a first metal film and a second metal film which are included in the resin board structure according to Preferred Embodiment 1 of the present invention.

Resin board structure 101 is obtained by bonding, as shown in FIG. 2, first member 51 and second member 52 which are prepared separately. As shown in FIG. 2, first junction resin covering portion 15 of first member 51 and a second junction resin covering portion 16 of second member 52 overlap each other. As shown in FIG. 3, the overlapping portion of first member 51 and second member 52 is placed on the top surface of an anvil 62 and pressurized by an ultrasonic horn 61 from the top in the direction of arrows 91. Ultrasonic horn 61 and anvil 62 are included in an ultrasonic bonding apparatus. While ultrasonic horn 61 including a flat bottom surface and anvil 62 including the flat top surface are shown herein, these surfaces may have microscopic unevenness to increase the frictional forces. Ultrasonic horn 61 is caused to ultrasonically vibrate as indicated by an arrow 92, while pressurizing the overlapping portion in the direction of arrows 91 in FIG. 3. As a result of the ultrasonic bonding, metallurgical bonding is provided between first metal film 13 and second metal film 14 as shown in the enlarged view in FIG. 4. At the same time, thermoplastic resin layers 2 around first metal film 13 and second metal film 14 are also welded together due to heating of the interface caused by the ultrasonic vibration. The position of the interface is schematically indicated by the dashed line shown in FIG. 4.

One example of a preferred embodiment of the present invention has been described above. However, the shapes of first member 51 and second member 52 are not limited thereto.

In the present preferred embodiment, the surface of first junction resin covering portion 15 preferably includes unevenness 15a to reduce or prevent slippage due to the ultrasonic vibration, thus reducing or preventing slippage of first member 51 due to the ultrasonic vibration. As a result, the ultrasonic bonding is performed, while reducing or preventing bond failure or misalignment. This achieves resin board structure 101 that has a good bond.

Preferably, first junction resin covering portion 15 is thinner than any other portions of first member 51. First junction resin covering portion 15 being thin as described above facilitates providing the ultrasonic vibration to the bonding interface.

Preferred Embodiment 2

Resin board structure 101 described in Preferred Embodiment 1 includes interlayer connection conductors which similarly extend from above and below first metal film 13 and second metal film 14 and are connected at the junction between these conductor films. However, preferred embodiments of the present invention are not limited to such arrangement.

Figure 5:
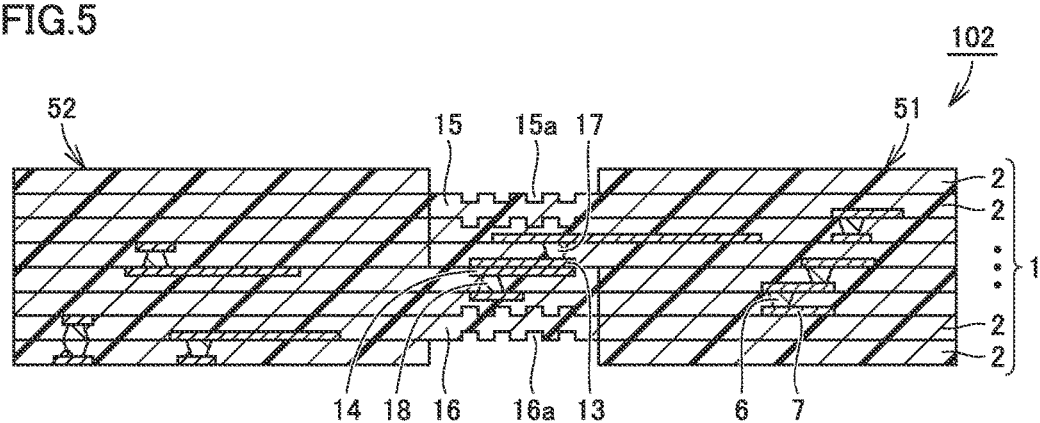
FIG. 5 is a cross-sectional view of a resin board structure according to Preferred Embodiment 2 of the present invention.

Referring to FIG. 5, a resin board structure 102 according to Preferred Embodiment 2 of the present invention is described.

In resin board structure 102, a first interlayer connection conductor 17 extending from within first member 51 is connected to first metal film 13, and a second interlayer connection conductor 18 extending from within second member 52 is connected to second metal film 14. Second interlayer connection conductor 18, extending from within second member 52, is connected to second metal film 14 at a different location from first interlayer connection conductor 17 as viewed in a direction perpendicular or substantially perpendicular to second metal film 14.

Even when first metal film 13 and second metal film 14 are bonded together, including the interlayer connection conductors disposed at different locations therein as described in the present preferred embodiment, slippage due to the ultrasonic vibration is likely to occur if no countermeasure is provided to reduce or prevent it. However, the present preferred embodiment includes first junction resin covering portion 15 which includes the surface including unevenness 15a to reduce or prevent slippage due to the ultrasonic vibration. Thus, the present preferred embodiment reduces or prevents the occurrence of bond failure or misalignment that is due to the slip caused by the ultrasonic vibration, and provides significant benefits therefrom.

It is not necessary that the thermoplastic resin layers are welded together around a location at which the metal films are metallurgically bonded by the ultrasonic bonding. However, as described in Preferred Embodiments 1 and 2, preferably, the thermoplastic resin layers are in contact and fused together (see FIG. 4). In other words, preferably, second member 52 includes one thermoplastic resin layer 2 or a stack which includes two or more thermoplastic resin layers 2, and first member 51 and second member 52 are welded together at the contact portion between thermoplastic resin layers 2. Bonding the thermoplastic resin layers in addition to bonding the metal films provides a solid, stable structure. The configuration in which the thermoplastic resin layers are additionally bonded is able to be achieved by adjusting the conditions of the ultrasonic vibration for the ultrasonic bonding. In particular, the configuration in which the thermoplastic resin layers are bonded together as well as the metal films being bonded together is able to be readily achieved, for example, by increasing a surface, which comes into contact with the object to be bonded, of the ultrasonic horn to be greater than the size of the metal film, as viewed from bottom, and increasing a surface, which comes into contact with the object to be bonded, of the anvil to be greater than the size of the metal film, as viewed from above.

Second member 52 need not include one thermoplastic resin layer 2 or the stack which includes two or more thermoplastic resin layers 2. Second member 52 may be a member other than the resin multilayer board. Second member 52 may be a member which includes no thermoplastic resin layer. In other words, only first member 51 may be a member which includes the thermoplastic resin layer.

Preferably, in the configuration in which second member 52 includes one thermoplastic resin layer 2 or the stack which includes two or more thermoplastic resin layers 2, and first member 51 and second member 52 are welded together at the contact portion between thermoplastic resin layers 2, second member 52 further includes the following configuration. In this case, preferably, second member 52 includes second junction resin covering portion 16 which is a portion of thermoplastic resin layer 2 and overlaps at least a portion of first metal film 13 and at least a portion of second metal film 14, and second junction resin covering portion 16 includes a surface having an unevenness 16a to reduce or prevent slippage due to the ultrasonic vibration. The examples shown in FIGS. 1 and 5 already include this configuration. Second junction resin covering portion 16 whose surface includes unevenness 16a enables the application of the ultrasonic vibration, while holding, from the second junction resin covering portion 16 side as well as from the first junction resin covering portion 15 side, first member 51 and second member 52 from slipping, thus more reliably reducing or preventing the slippage due to the ultrasonic vibration. As a result, good ultrasonic bonding is provided, while reducing or preventing the occurrence of bond failure or misalignment.

While unevenness 15a, 16a has been described above with reference to the cross-sectional views, the patterns of unevenness 15a and unevenness 16a as viewed from above and below are to be described.

Figure 6:
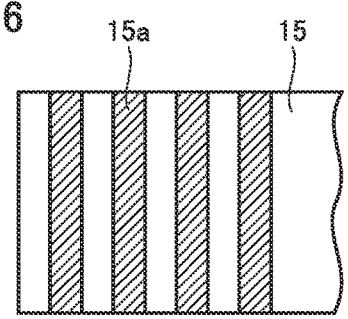
FIG. 6 is a plan view of a first example of a metal film pattern at a junction.
Figure 7:
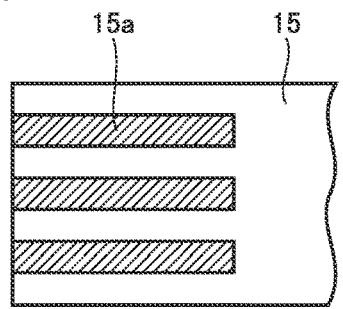
FIG. 7 is a plan view of a second example of the metal film pattern at the junction.

FIG. 6 shows an example of first junction resin covering portion 15 as viewed from above. For convenience of illustration, the lower portions of unevenness 15a are shown hatched in FIG. 6. Non-hatched blank portions are higher than the hatched portions. In the example shown herein, unevenness 15a is preferably structured as a striped pattern which is a repeating pattern of straight grooves extending in a direction perpendicular or substantially perpendicular to the longitudinal direction (the left to right direction in FIG. 6) of first junction resin covering portion 15. The direction of the striped pattern is provided merely by way of example, and preferred embodiments of the present invention are not limited thereto. Unevenness 15a may preferably be structured as a striped pattern which is a repeating pattern of straight grooves extending in a direction parallel or substantially parallel to the longitudinal direction (the left to right direction in FIG. 7) of first junction resin covering portion 15, as shown in FIG. 7, for example.

Figure 8:
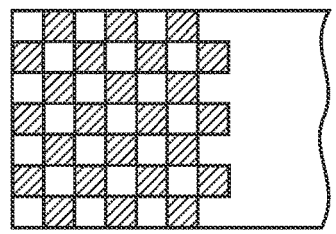
FIG. 8 is a plan view of a third example of the metal film pattern at the junction.

Unevenness 15a is not limited to striped patterns. Unevenness 15a may preferably be structured as a checkered pattern, as shown in FIG. 8 for example. The lower portions of unevenness 15a are also shown hatched in FIG. 8.

Those described with reference to FIGS. 6 through 8 apply also to unevenness 16a in second junction resin covering portion 16. The patterns of unevenness 15a, 16a are not limited to the striped pattern or the checkered pattern, and may be any other suitable patterns or random patterns.

Preferred Embodiment 3

Figure 9:
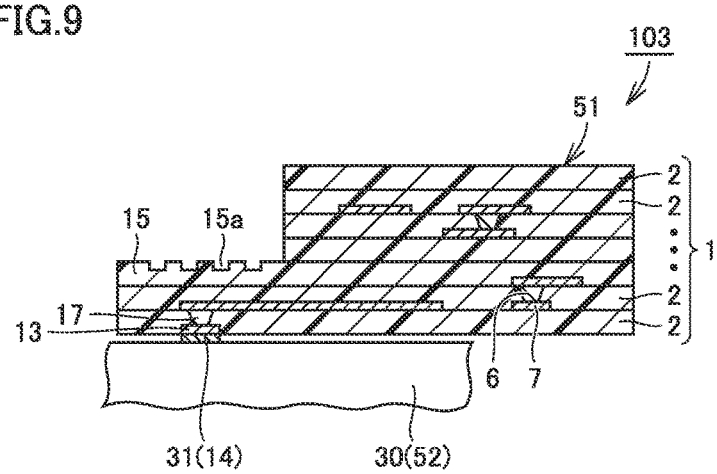
FIG. 9 is a cross-sectional view of a resin board structure according to Preferred Embodiment 3 of the present invention.

Referring to FIG. 9, a resin board structure according to Preferred Embodiment 3 of the present invention is described. FIG. 9 shows a cross-sectional view of a resin board structure 103 according to the present preferred embodiment.

Resin board structure 103 includes first member 51 including first metal film 13 and one thermoplastic resin layer 2 or stack 1 which includes two or more thermoplastic resin layers 2, and second member 52 including second metal film 14. Second member 52 is a motherboard 30. Motherboard 30 may not include a stack of thermoplastic resin layers. Motherboard 30 may preferably be a printed circuit board, for example. First metal film 13 and second metal film 14 are bonded together, at least a portion of first metal film 13 and at least a portion of second metal film 14 overlap each other. First metal film 13 and second metal film 14 are metallurgically bonded at an interface between first metal film 13 and second metal film 14. Second metal film 14 is a pad electrode 31 on the surface of motherboard 30. First member 51 includes first junction resin covering portion 15 which is a portion of thermoplastic resin layer 2 and overlaps a portion at which first metal film 13 and second metal film 14 overlap each other. First junction resin covering portion 15 includes a surface including unevenness 15a to reduce or prevent a slip due to ultrasonic vibration.

In the present preferred embodiment, as with Preferred Embodiment 1, ultrasonic bonding is able to be provided, while reducing or preventing slippage due to the ultrasonic vibration and reducing or preventing the occurrence of bond failure or misalignment due to the slippage, thus providing resin board structure 103 having a good bond. As described in the present preferred embodiment, the connection between the stack which includes the thermoplastic resin layers and the motherboard which is not such a stack also benefits from the present invention, due to the surface of first junction resin covering portion 15 having unevenness 15a to reduce or prevent slippage due to the ultrasonic vibration.

Preferred Embodiment 4

Figure 10:
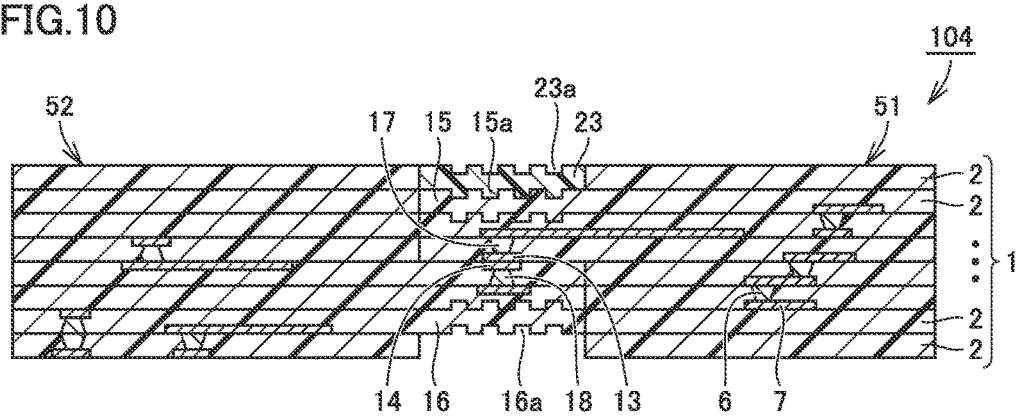
FIG. 10 is a cross-sectional view of a resin board structure according to Preferred Embodiment 4 of the present invention.

Referring to FIG. 10, a resin board structure according to Preferred Embodiment 4 of the present invention is described. FIG. 10 shows a cross-sectional view of a resin board structure 104 according to the present preferred embodiment.

Resin board structure 104 is similar to resin board structure 101 according to Preferred Embodiment 1, except for the following structure.

In resin board structure 104, a first protective film 23 is provided over the surface of first junction resin covering portion 15, and first protective film 23 includes a surface including unevenness 23a to reduce or prevent slippage due to ultrasonic vibration. First protective film 23 may preferably be, for example, a resist film. First protective film 23 may also be, for example, a resin film, such as a coverlay film.

In the present preferred embodiment, first junction resin covering portion 15 is protected by first protective film 23. Since unevenness 23a is provided in the surface of first protective film 23, even after first protective film 23 is provided over first junction resin covering portion 15, unevenness 23a enables ultrasonic bonding to be provided, while reducing or preventing slippage due to the ultrasonic vibration and reducing or preventing the occurrence of bond failure or misalignment due to the slippage. As a result, resin board structure 104 having a good bond is achieved.

In particular, when first junction resin covering portion 15 is thinner than any other portions, significant reinforcing benefits are obtained by providing such a protective film, thus increasing reliability.

Preferred Embodiment 5

Figure 11:
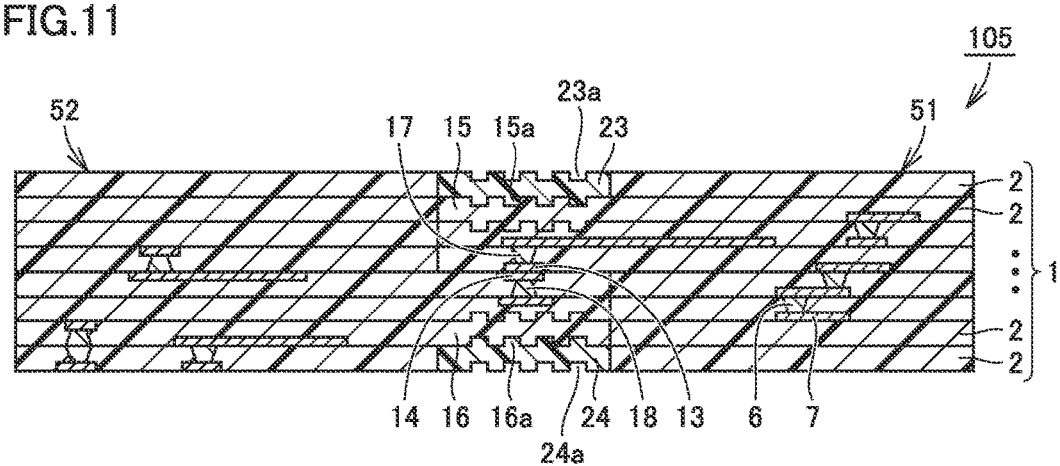
FIG. 11 is a cross-sectional view of a resin board structure according to Preferred Embodiment 5 of the present invention.

Referring to FIG. 11, a resin board structure according to Preferred Embodiment 5 of the present invention is described. FIG. 11 shows a cross-sectional view of a resin board structure 105 according to the present preferred embodiment.

Resin board structure 105 is similar to resin board structure 104 according to Preferred Embodiment 4, except for the following structure.

First protective film 23 is provided over the surface of first junction resin covering portion 15, first protective film 23 includes a surface including unevenness 23a to reduce or prevent slippage due to the ultrasonic vibration, a second protective film 24 is provided over the surface of second junction resin covering portion 16, and second protective film 24 includes a surface including unevenness 24a to reduce or prevent slippage due to the ultrasonic vibration.

In the present preferred embodiment, since second protective film 24, as well as first protective film 23, is provided, the junction is protected from the second junction resin covering portion 16 side, as well as from the first junction resin covering portion 15 side. Since the surface of first protective film 23 includes unevenness 23a and the surface of second protective film 24 includes unevenness 24a, the ultrasonic bonding is provided, while reducing or preventing, by both unevenness 23a, 24a, slippage due to the ultrasonic vibration and the occurrence of bond failure or misalignment due to the slippage, thus achieving resin board structure 105 including a good bond.

Preferred Embodiment 6

Figure 12:
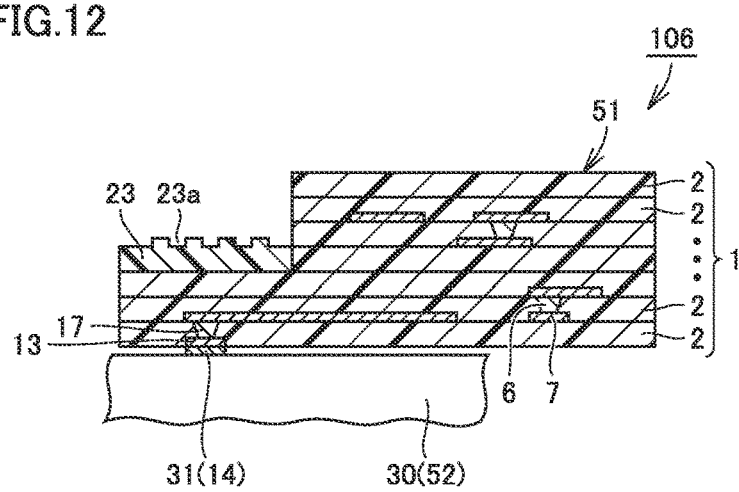
FIG. 12 is a cross-sectional view of a resin board structure according to Preferred Embodiment 6 of the present invention

Referring to FIG. 12, a resin board structure according to Preferred Embodiment 6 of the present invention is described. FIG. 12 shows a cross-sectional view of a resin board structure 106 according to the present preferred embodiment.

In resin board structure 106, second member 52 is motherboard 30. Resin board structure 106 includes first member 51 including first metal film 13 and one thermoplastic resin layer 2 or stack 1 which includes two or more thermoplastic resin layers 2; and second member 52 including second metal film 14. First metal film 13 and second metal film 14 are bonded together, at least a portion of first metal film 13 and at least a portion of second metal film 14 overlap each other. First metal film 13 and second metal film 14 are metallurgically bonded at an interface between at least a portion of first metal film 13 and at least a portion of second metal film 14. First member 51 includes a first junction resin covering portion which is a portion of thermoplastic resin layer 2 and overlaps the at least a portion of first metal film 13 and the at least a portion of second metal film 14. First protective film 23 is provided over the surface of the first junction resin covering portion and first protective film 23 includes a surface including unevenness 23a to reduce or prevent slippage due to ultrasonic vibration.

As described in the present preferred embodiment, the configuration, in which second member 52 is motherboard 30, first protective film 23 is provided over the surface of the first junction resin covering portion, and the surface of first protective film 23 includes unevenness 23a, enables the ultrasonic bonding to be provided, while reducing or preventing, by unevenness 23a, the occurrence of slippage due to the ultrasonic vibration. As a result, resin board structure 106 including a good bond is achieved.

Preferred Embodiment 7

Referring to FIGS. 13 and 1 through 3, a method for fabricating the resin board structure according to Preferred Embodiment 7 of the present invention is described. FIG. 13 shows a flowchart of the method for fabricating the resin board structure according to the present preferred embodiment.

The method for fabricating the resin board structure according to the present preferred embodiment includes step S1 of preparing first member 51 including first metal film 13 and one thermoplastic resin layer 2 or stack 1 which includes two or more thermoplastic resin layers 2, first member 51 including first junction resin covering portion 15 which is a portion of a thermoplastic resin layer and overlaps first metal film 13, first junction resin covering portion 15 including a surface including unevenness 15a; step S2 of preparing second member 52 including second metal film 14; step S3 (see FIG. 2) of disposing first member 51 and second member 52, at least a portion of first metal film 13 and at least a portion of second metal film 14 being in contact with each other and overlapping each other; and step S4 (see FIG. 3) of bonding first metal film 13 and second metal film together by application of relative ultrasonic vibration between first metal film 13 and second metal film 14. This provides resin board structure 101 as shown in FIG. 1.

In the present preferred embodiment, first junction resin covering portion 15 of first member 51 includes the surface including unevenness 15a. Thus, in step S4, the ultrasonic bonding is provided, while reducing or preventing slippage due to the ultrasonic vibration and reducing or preventing the occurrence of bond failure or misalignment due to the slippage.

Note that in the method for fabricating the resin board structure according to the present preferred embodiment, preferably, first junction resin covering portion 15 is thinner than any other portions of first member 51. First junction resin covering portion 15 being thin as such facilitates providing the ultrasonic vibration to the bonding interface in step S4.

In the method for fabricating the resin board structure according to the present preferred embodiment, preferably, second member 52 includes one thermoplastic resin layer 2 or stack 1 which includes two or more thermoplastic resin layers 2, and bonding step S4 bonds first member 51 and second member 52 together by welding at a contact portion between thermoplastic resin layers 2. A solid, stable structure is obtained by bonding thermoplastic resin layers together by welding as such, in addition to bonding the metal films together.

While second member 52 shown in FIGS. 1 through 3 is also a stack of the thermoplastic resin layers, the type of second member 52 is not limited thereto to perform the method for fabricating the resin board structure. In the method for fabricating the resin board structure according to the present preferred embodiment, second member 52 may be motherboard 30, as illustrated in FIGS. 9 and 12.

Preferred Embodiment 8

A method for fabricating a resin board structure according to Preferred Embodiment 8 of the present invention is to be described.

The method for fabricating the resin board structure according to the present preferred embodiment includes preparing a first member including a first metal film and one thermoplastic resin layer or a stack which includes two or more thermoplastic resin layers, the first member including a first junction resin covering portion which is a portion of a thermoplastic resin layer and overlaps the first metal film; preparing a second member which includes a second metal film; disposing the first member and the second member, at least a portion of the first metal film and at least a portion of the second metal film being in contact with each other and overlapping each other; and bonding the first metal film and the second metal film together by application of relative ultrasonic vibration between the first metal film and the second metal film, wherein the first member includes a first protective film covering a surface of the first junction resin covering portion, the first protective film including a surface including unevenness.

In the present preferred embodiment, the unevenness is provided in the surface of the first protective film covering the surface of the first junction resin covering portion in the first member. Thus, the ultrasonic bonding is provided, while reducing or preventing slippage due to the ultrasonic vibration and reducing or preventing the occurrence of bond failure or misalignment due to the slippage (see FIG. 12). The "unevenness," as used herein, reduces or prevents the slippage due to the ultrasonic vibration.

Note that two or more of the above preferred embodiments may be combined as appropriate.

Also note that the above preferred embodiments presently disclosed are illustrative in all aspects and do not limit the present invention.

The scope of the present invention is indicated by the appended claimed, rather than by the above description, and encompass all changes that come within the meaning and range of equivalency of the appended claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin board structure comprising:
a first member including a first metal film and one thermoplastic resin layer or a stack which includes two or more thermoplastic resin layers; and
a second member including a second metal film; wherein
the first metal film and the second metal film are bonded together, at least a portion of the first metal film and at least a portion of the second metal film overlap each other, the first metal film and the second metal film being metallurgically bonded at an interface between the first metal film and the second metal film;
the first member includes a first junction resin covering portion including a portion of a thermoplastic resin layer and overlapping a portion at which the first metal film and the second metal film overlap each other;
the first junction resin covering portion includes an uneven surface including unevenness to reduce or prevent slippage due to ultrasonic vibration;
the second member includes a second junction resin covering portion defined by a portion of a thermoplastic resin layer and overlapping a portion at which the first metal film and the second metal film overlap each other; and
the second junction resin covering portion includes an uneven surface including unevenness to reduce or prevent slippage due to ultrasonic vibration.

2. The resin board structure according to claim 1, wherein the first junction resin covering portion is thinner than any other portions of the first member.

3. The resin board structure according to claim 1, wherein
the second member includes one thermoplastic resin layer or a stack which includes two or more thermoplastic resin layers; and
the first member and the second member are welded together at a contact portion between thermoplastic resin layers.

4. The resin board structure according to claim 1, wherein the second member is a motherboard.

5. The resin board structure according to claim 1, further comprising a first protective film provided over a surface of the first junction resin covering portion, the first protective film including an uneven surface including unevenness to reduce or prevent slippage due to ultrasonic vibration.

6. The resin board structure according to claim 1, further comprising:
a first protective film provided over a surface of the first junction resin covering portion, the first protective film including an uneven surface including unevenness to reduce or prevent slippage due to ultrasonic vibration; and
a second protective film provided over a surface of the second junction resin covering portion, the second protective film including an uneven surface including unevenness to reduce or prevent slippage due to ultrasonic vibration.

7. A resin board structure comprising:
a first member including a first metal film and including one thermoplastic resin layer or a stack which includes two or more thermoplastic resin layers; and
a second member including a second metal film; wherein
the first metal film and the second metal film are bonded together, at least a portion of the first metal film and at least a portion of the second metal film overlap each other, the first metal film and the second metal film being metallurgically bonded at an interface between the first metal film and the second metal film;

the first member includes a first junction resin covering portion defined by a portion of a thermoplastic resin layer and overlapping a portion at which the first metal film and the second metal film overlap each other;

a first protective film is provided over a surface of the first junction resin covering portion, the first protective film including an uneven surface including unevenness to reduce or prevent slippage due to ultrasonic vibration;

the second member includes a second junction resin covering portion including a portion of a thermoplastic resin layer and overlapping a portion at which the first metal film and the second metal film overlap each other; and the second junction resin covering portion includes an uneven surface including unevenness to reduce or prevent slippage due to ultrasonic vibration.

8. The resin board structure according to claim 7, wherein the second member is a motherboard.

9. The resin board structure according to claim 7, wherein a second protective film is provided over a surface of the second junction resin covering portion, the second protective film including an uneven surface including unevenness to reduce or prevent slippage due to ultrasonic vibration.

10. The resin board structure according to claim 2, wherein the first junction resin covering portion is thinner than any other portions of the first member.

11. A method for fabricating a resin board structure, the method comprising:

preparing a first member including a first metal film and one thermoplastic resin layer or a stack which includes two or more thermoplastic resin layers, the first member including a first junction resin covering portion defined by a portion of a thermoplastic resin layer and overlapping the first metal film, the first junction resin covering portion including an uneven surface including unevenness to reduce or prevent slippage due to ultrasonic vibration;

preparing a second member including a second metal film;

disposing the first member and the second member such that at least a portion of the first metal film and at least a portion of the second metal film are in contact with each other and overlap each other; and bonding the first metal film and the second metal film together by application of relative ultrasonic vibration between the first metal film and the second metal film.

12. The method according to claim 11, wherein the first junction resin covering portion is thinner than any other portions of the first member.

13. The method according to claim 11, wherein
the second member includes one thermoplastic resin layer or a stack which includes two or more thermoplastic resin layers; and
bonding the first metal film and the second metal film together bonds the first member and the second member together by welding at a contact portion between thermoplastic resin layers.

14. The method according to claim 11, wherein the second member is a motherboard.

15. A method for fabricating a resin board structure, the method comprising:

preparing a first member including a first metal film and including one thermoplastic resin layer or a stack which includes two or more thermoplastic resin layers, the first member including a first junction resin covering portion defined by a portion of a thermoplastic resin layer and overlapping the first metal film;

preparing a second member having a second metal film;

disposing the first member and the second member such that at least a portion of the first metal film and at least a portion of the second metal film are in contact with each other and overlap each other; and bonding the first metal film and the second metal film together by application of relative ultrasonic vibration between the first metal film and the second metal film; wherein the first member includes a first protective film covering a surface of the first junction resin covering portion, the first protective film including an uneven surface including unevenness to reduce or prevent slippage due to ultrasonic vibration.

16. The method according to claim 15, wherein the first junction resin covering portion is thinner than any other portions of the first member.

17. The method according to claim 15, wherein the second member is prepared to further include one thermoplastic resin layer or a stack which includes two or more thermoplastic resin layers, a second junction resin covering portion including a portion of a thermoplastic resin layer and overlapping the second metal film, and a second protective film covering a surface of the second junction resin covering portion, the second protective film including an uneven surface to reduce or prevent slippage due to ultrasonic vibration.

* * * * *